United States Patent
Bedeschi et al.

(10) Patent No.: US 7,388,775 B2
(45) Date of Patent: *Jun. 17, 2008

(54) DETECTING SWITCHING OF ACCESS ELEMENTS OF PHASE CHANGE MEMORY CELLS

(75) Inventors: Ferdinando Bedeschi, Biassono (IT); Claudio Resta, Pavia (IT); Ward D. Parkinson, Boise, ID (US); Roberto Gastaldi, Agrate Brianza (IT)

(73) Assignee: Ovonyx, Inc., Rochester Hills, MI (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/527,147

(22) Filed: Sep. 26, 2006

(65) Prior Publication Data
US 2007/0019465 A1 Jan. 25, 2007

Related U.S. Application Data

(63) Continuation of application No. 11/093,709, filed on Mar. 30, 2005, now Pat. No. 7,154,774.

(51) Int. Cl.
*G11C 11/00* (2006.01)
(52) U.S. Cl. .................. 365/163; 365/148; 365/225.7; 365/189.07; 365/194
(58) Field of Classification Search ............... 365/163, 365/148, 194, 225.7, 189.07
See application file for complete search history.

(56) References Cited

U.S. PATENT DOCUMENTS

| | | | | |
|---|---|---|---|---|
| 5,276,653 | A * | 1/1994 | McKenny | 365/225.7 |
| 7,012,834 | B2 * | 3/2006 | Cho et al. | 365/163 |
| 7,154,774 | B2 * | 12/2006 | Bedeschi et al. | 365/163 |
| 7,203,087 | B2 * | 4/2007 | Resta et al. | 365/148 |
| 2006/0221678 | A1 * | 10/2006 | Bedeschi et al. | 365/163 |
| 2006/0221712 | A1 * | 10/2006 | Lowrey et al. | 365/189.01 |
| 2006/0227591 | A1 * | 10/2006 | Lowrey et al. | 365/148 |
| 2006/0227592 | A1 * | 10/2006 | Parkinson et al. | 365/148 |

* cited by examiner

*Primary Examiner*—Andrew Q Tran
(74) *Attorney, Agent, or Firm*—Trop, Pruner & Hu, P.C.

(57) ABSTRACT

A memory includes a storage element (OUM) made of a phase-change material for storing a logic value and an access element (OTS) switching from a higher resistance condition to a lower resistance condition in response to a selection of the memory cell, the access element in the higher resistance condition decoupling the storage element from a read circuit and in the lower resistance condition coupling the storage element to the read circuit. The read circuit includes a sense amplifier to determine the logic value stored in the memory cell according to an electrical quantity associated with the memory cell. The read circuit further includes a detector that detects the switching of the access element by comparison to a delayed waveform or sensing a change in the column rate of change, and a circuit to enable the sense amplifier in response to the detection of the switching of the access element.

12 Claims, 8 Drawing Sheets

US 7,388,775 B2

DETECTING SWITCHING OF ACCESS ELEMENTS OF PHASE CHANGE MEMORY CELLS

CROSS-REFERENCE TO RELATED APPLICATIONS

This application is a continuation of U.S. patent application Ser. No. 11/093,709, filed on Mar. 30, 2005 now U.S. Pat No. 7,154,774.

BACKGROUND

The present invention generally relates to the field of non-volatile memories based on phase-change materials, also known in the art as ovonic unified memories.

Ovonic unified or phase-change memories are an emerging type of electrically-alterable non-volatile semiconductor memories. These memories exploit the properties of materials (phase-change materials) that can be reversibly switched between an amorphous phase and a crystalline phase when heated. A phase-change material exhibits different electrical characteristics, particularly a different resistivity, peculiar to each one of the two phases; thus, each material phase can be conventionally associated with a corresponding one of the two logic values, "1" and "0".

Typically, the memory includes a matrix of phase-change memory cells, arranged in rows and columns with associated word lines and bit lines, respectively. Each memory cell consists of a storage element usually connected in series to an access element; each memory cell is connected between the respective word line and the respective bit line.

The memory cells can be selected for a reading operation, for example, by applying suitable voltages to the respective word lines and suitable current pulses to the respective bit lines. A voltage reached at the bit line depends on the resistance of the storage element, i.e., on the logic value stored in the selected memory cell.

The logic value stored in the memory cell is evaluated by sense amplifiers of the memory. Typically, a sense amplifier includes a comparator receiving the bit line voltage, or a related voltage, and a suitable reference voltage. In the case in which the bit line voltage is higher than the reference voltage, this situation, for example, is decreed to correspond to a stored logic value "0", whereas in the case in which the bit line voltage is smaller than the reference voltage, this situation is decreed to correspond to the stored logic value "1".

While the access element can consist of a select transistor or diode, the threshold switch may be made of a phase-change material, similarly to the storage element serially connected thereto. This element switches (without changing its phase) from a high-resistance condition to a low-resistance condition when a voltage applied thereacross exceeds a threshold value and reverts to the high-resistance condition when a current flowing therethrough falls below a minimum holding value. A voltage across the access element in the low-resistance condition has a substantially constant value (holding voltage), such as about 1V, in series with a dynamic resistance dV/dI, such as about 200 ohms. In this case, the matrix of memory cells can be advantageously provided without any transistor, and then using a single technological thin film process.

During a reading operation, the read current pulse causes the charging (or discharging, depending on polarity selected by the designer) of stray capacitance intrinsically associated with the bit line, and, accordingly, a corresponding transient of the bit line voltage at each selected bit line. The respective bit line voltage raises towards a corresponding steady value, Vfinal, depending on the logic value stored in the selected memory cell.

The transient of the bit line voltage depends not only on the stray capacitances associated with the bit lines, but also on operative parameters of the storage elements and of the access elements, such as impedance and threshold/holding voltages. Accordingly, it may be difficult to design robust sense amplifiers for high margin reading of memories based on a phase-change material because of a large variability in those operative parameters of the storage elements and of the access elements, since parameters also vary with temperature. A problem is that such a variability usually involves a reduction in a discrimination margin between the reference voltage and a value of the bit line voltage to be compared thereto.

Furthermore, a variability in the threshold voltage of the access element brings to an uncertainty on a time in which the access element is switched on and then on a time in which the bit line voltage reaches a steady-state value to be sensed. Accordingly, such a variability has to be taken into account for the timing of a reading operation. Inevitably, the reading operation is slowed down, since the timing has to be based on the worst cases.

BRIEF DESCRIPTION OF THE DRAWINGS

Further features and the advantages of the solution according to the present invention will be made clear by the following description of a preferred embodiment thereof, given purely by way of a non-restrictive indication, with reference to the attached figures, in which.

DETAILED DESCRIPTION

Figure 1:
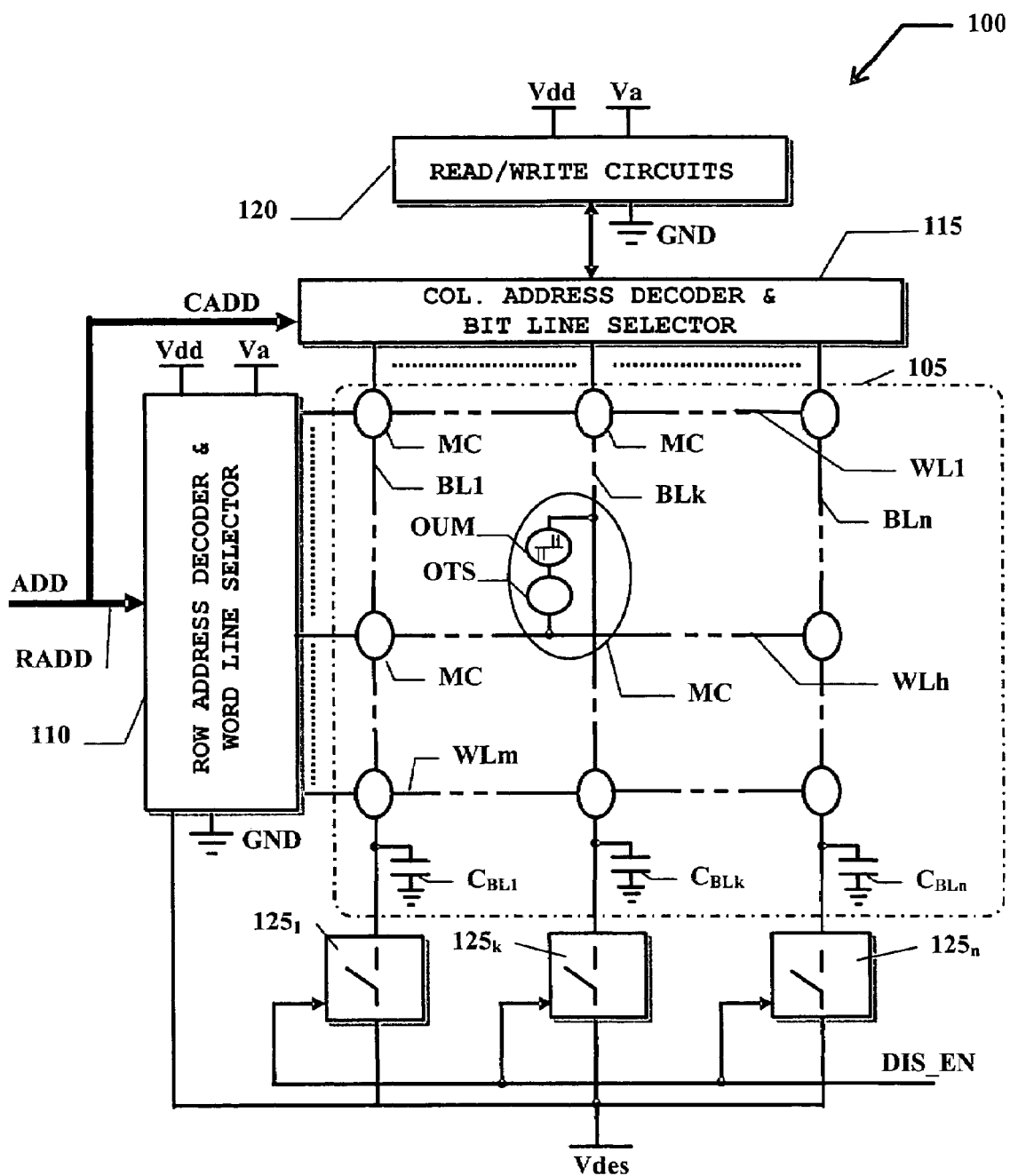
FIG. 1 schematically shows the relevant circuit blocks of an example memory device in which the present invention may be applicable.

With reference to the drawings, in FIG. 1 the functional blocks of a semiconductor memory device 100 relevant to the understanding of the invention embodiments herein described are schematically shown. Specifically, the semiconductor memory device 100 is an electrically-alterable non-volatile memory device based on phase-change materials, but may also be any memory form or type in which the memory states differ in impedance. The select device may instead be a transistor or diode, or other alternatives to the ots select elemement shown. Such other alternatives and implementations will be evident to those reasonably skilled in the art.

The memory device 100 includes a matrix 105; the memory cells MC in the matrix 105 are arranged by m rows and n columns; a respective word (row) line WL1-WLm may be associated with each matrix row, and a respective bit (column) line BL1-BLn may be associated with each matrix column.

The memory device 100 also includes a number of auxiliary lines, useful for the operation thereof. In particular, the memory device 100 is provided with a supply voltage line Vdd, distributing a supply voltage Vdd throughout a chip including the memory device 100, that, depending on the specific memory device embodiment, may be, typically, from 1 to 3 V, for example 1.8 V. A further supply voltage line (such as a ground voltage line GND) distributes the ground voltage or a negative voltage. A high voltage supply line Va provides a relatively high voltage, generated by devices (e.g. charge-pump voltage boosters not shown in the drawing) integrated on the same chip, or externally supplied to the memory device 100; for example, the high voltage Va may be 4.5-5 V.

Each memory cell MC in the matrix 105 includes an ovonic unified memory element OUM, i.e., a storage element having a programmable resistivity; the storage element OUM is connected in series to an associated access element, in the shown example consisting of an ovonic threshold switch (OTS) and hereinafter referred to as an access element or OTS.

Each storage element OUM is made of a phase-change material, typically consisting of a chalcogenide (e.g., a $Ge_2Sb_2Te_5$ alloy; that is 225). The phase-change material can be reversibly switched between a generally amorphous, disordered phase and a generally crystalline, highly ordered phase. The two phases of the material exhibit different electrical characteristics; particularly, when the material is in the amorphous phase, it exhibits a relatively high resistivity, whereas when the material is in the crystalline phase, it has a low resistivity. It is the material resistivity difference in the two phases that is exploited to store a binary value. If the storage element OUM is in the amorphous phase, characterized by a high resistivity, the memory cell MC is conventionally considered in a reset state, and this state is associated with a binary value, for example "0"; if the storage element OUM is in the crystalline phase, characterized by a low resistivity, the memory cell MC is conventionally considered in a set state, which is associated with the opposite binary value, in the example herein considered "1".

Without entering into particulars, which are reasonably well known in the art, the phase of the phase-change material is stable below a predefined temperature (such as 150° C.). The material phase can be changed by heating the material over such a temperature; for this purpose, a voltage or current higher than a corresponding phase-change value $Vth_{oum}$ or Ithoum (for example, 1V or 1 ma) is applied to the storage element OUM. The applied voltage or current causes the flow of a current through a resistive element placed in contact to the phase-change material of the storage element OUM; the resistive element acts as a local Joule-effect heater, and accordingly raises the temperature of the phase-change material. Depending on the voltage applied, if the storage element OUM is heated over a "nucleation" temperature (typically above 200° C.) and then cooled down slowly, the phase-change material becomes crystalline; conversely, if the storage element OUM is heated over a higher, melting temperature (such as 600° C.) and then cooled down rapidly, the phase-change material becomes amorphous.

The state of the storage element OUM can be detected by sensing the current flowing therethrough when a read voltage is applied, depending on the resistivity of the phase-change material and providing therefore an indication of the material phase. Alternately, a current may be forced and voltage sensed that correlates to cell state. A voltage dropping across the storage element OUM may be suitably lower than the phase-change value Vthoum when the bit is amorphous, in order to prevent an undesired change of phase of the material that may occur for repeated reads if Vth is repeatedly exceeded without re-writing (refreshing) the bit. When reading a crystalline bit, the current should be suitably lower than the current at which the bit may be gradually changed to the amorphous state, Isafe.

Similarly to the storage element OUM, the access element OTS typically consists of a chalcogenide, but may be in one single phase, generally amorphous. Particularly, the access element OTS may be a two-terminal device which switches from a high-resistance condition to a low-resistance condition when a voltage applied thereacross or the current therethrough exceeds a threshold value $Vth_{OTS}$ at Ithots (for example, about 3 V and about 1 ua), and reverts to the high-resistance condition when a current flowing therethrough falls below a minimum holding value Ih (for example, a few microamperes or less). Preferably, the high resistance of the access element OTS at its threshold is greater than the high resistance of the storage element OUM below its threshold, when the OUM is programmed at the logic value "0".

In detail, the access element OTS has two distinct operation regions associated with the high and low resistance; below the threshold voltage $Vth_{OTS}$, the access element OTS conducts a current approximately equal to zero, whereas over the threshold voltage $Vth_{OTS}$ the access element OTS conducts a current at least equal to the holding current Ih at a substantially constant voltage $Vh_{OTS}$ (hereinafter referred to as holding voltage). The holding voltage $Vh_{OTS}$ may be lower than the threshold voltage $Vth_{OTS}$ (for example, about 2.5 V). When the access element OTS switches from the high-resistance condition to the low-resistance condition, a voltage across the access element OTS then may snap back from Vthots to a lower voltage, Vhots+IxR(dV/dI), where R(dV/dI) is the dynamic resistance of the OTS after switching (triggering on). The above-described behavior of the access element OTS may be symmetrical, i.e. the access element OTS may be a bi-directional device with similar characteristics in each direction.

Each memory cell MC in the matrix 105 is connected to a respective one of the word lines WL1-WLm and a respective one of the bit lines BL1-BLn. Additional "dummy" unused lines may surround the array, as well as repair lines. In particular, within each memory cell MC the storage element OUM has a first terminal connected to the respective bit line BL1-BLn and a second terminal connected to a first terminal of the associated access element OTS; the access element OTS has a second terminal connected to the respective word line WL1-WLm. Alternatively, the storage element OUM may be connected to the respective word line WL1-WLm and the access element OTS may be connected to the respective bit line BL1-BLm.

A generic memory cell MC within the matrix 105 is accessed by selecting the corresponding row and column pair, i.e. by selecting the corresponding word line and bit line. To this purpose, word line selector circuits 110 and bit line selector circuits 115 are provided to perform the selection of the word lines and of the bit lines on the basis of a row address binary code RADD and a column address binary code CADD, respectively, which are part of a memory address binary code ADD, for example received by the memory device 100 from a device external to the memory (e.g., a microprocessor). The word line selector circuits 110 decode the row address code RADD and select a corresponding one of the word lines WL1-WLm. The bit line selector circuits 115 decode the column address code CADD and select a corresponding bit line or, more generally, a corresponding bit line packet of the bit lines BL1-BLn (for example, the number of selected bit lines depends on the number of bits that can be processed during a burst reading operation on the memory device 100).

The bit-line selector circuits 115 interface with read/write circuits schematized as a block 120. The read/write circuits 120 include all the components which are normally required for writing the desired logic values into the selected memory cells MC, and for reading the logic values currently stored therein. For example, the read/write circuits 120 include, e.g., 128 sense amplifiers together with comparators, reference current/voltage generators and current generators exploited for reading and writing the logic values stored in the memory cells MC.

In a stand-by operating condition, as well as before any read or write access to the memory device 100, the word line selection circuits 110 keep all the word lines WL1-WLm at a relatively high de-selection voltage Vdes, such as a voltage roughly equal to half the high voltage Va (Va/2). At the same time, the bit line selection circuits 115 keep all the bit lines BL1-BLn disconnected from the read/write circuits 120 or, alternatively, at the de-selection voltage Vdes. In this way, none of the memory cells MC is accessed, since the bit lines BL1-BLn are floating or a voltage approximately equal to zero drops across the access elements OTS. The bit lines and word lines may be at the same voltage when deselected. Alternately, during deselection or at the beginning of the a active cycle, the bit lines may be lower than the word lines, such as at Va/3 and row lines at 2Va/3, thus increasing the deselect voltage margins but increasing deselect or standby leakage.

During a reading or a writing operation, the word line selection circuits 110 lower the voltage of a selected one of the word lines WL1-WLm to a word line selection voltage $V_{WL}$ (having, for example, a value approximately equal to 0 V—the ground), while the remaining word lines are kept at the word line de-selection voltage; similarly, the bit line selection circuits 115 couple a selected one of the bit lines BL1-BLn (more typically, a selected bit line packet) to the read/write circuits 120, while the remaining, non-selected bit lines are left floating (or kept at the de-selection voltage Vdes).

The read current causes the charging of stray capacitances (typically, of about 1 pF), intrinsically associated with the bit lines BL1-BLn (represented in the drawing as capacitors $C_{BL1}$-$C_{BLn}$ connected to respective bit lines BL1-BLn).

In order to avoid spurious reading of the memory cells MC, the bit line capacitors $C_{BL1}$-$C_{BLn}$ need to be discharged before performing a read operation. To this purpose, bit line discharge circuits $125_1$-$125_n$, known in the art and therefore merely schematized as blocks in the drawings, are associated with each bit line BL1-BLn. The bit line discharge circuits $125_1$-$125_n$ are connected between the associated bit line BL1-BLn and a de-selection voltage supply line Vdes providing the de-selection voltage Vdes. When the bit line discharge circuits $125_1$-$125_n$ are enabled in a bit line discharge phase of the memory device, preceding any operation, the bit line stray capacitances $C_{BL1}$-$C_{BLN}$ are discharged to the de-selection voltage Vdes. The bit line discharge circuits $125_1$-$125_n$ are controlled by means of a discharge enable signal DIS_EN.

Figure 2:
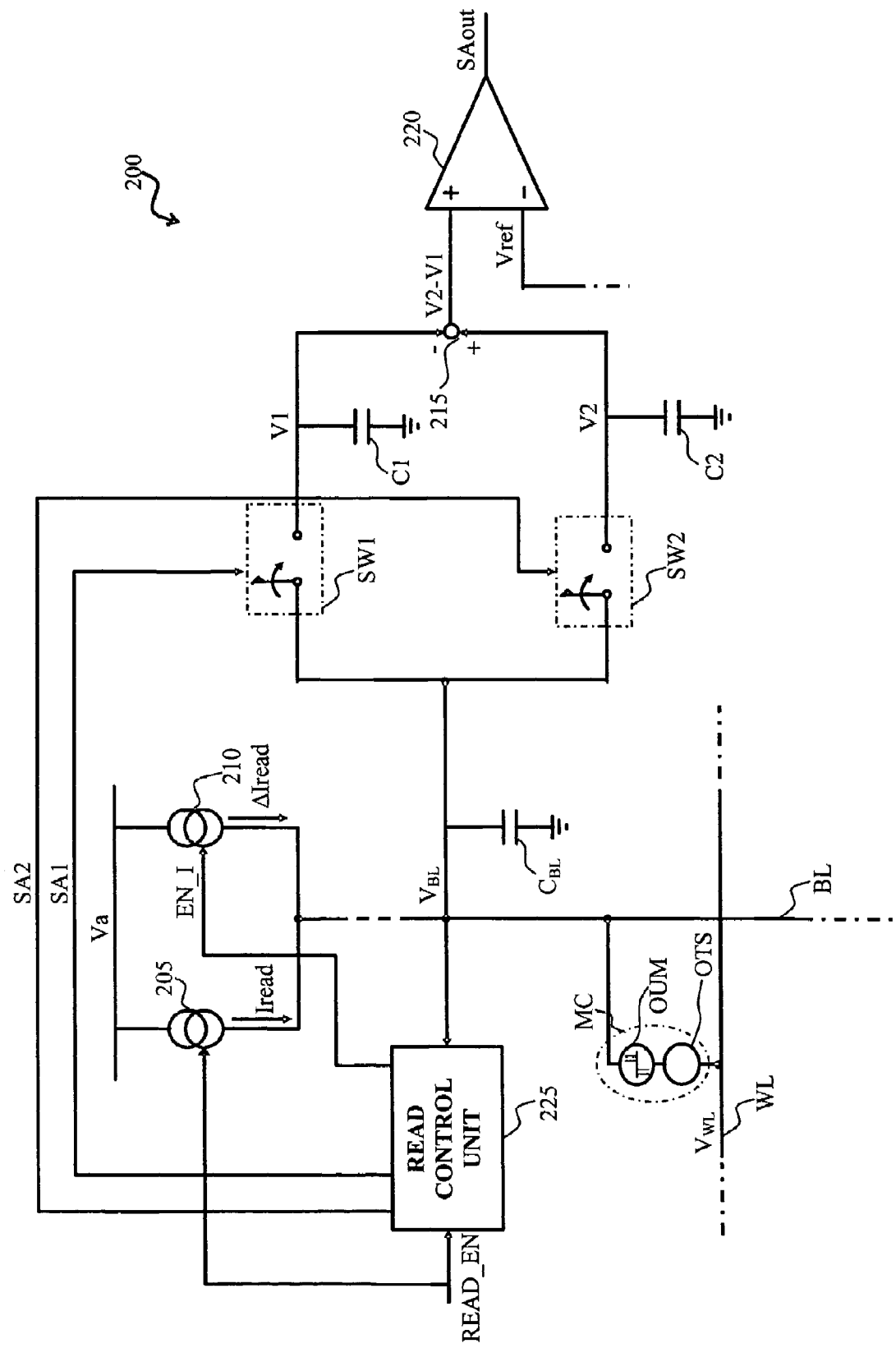
FIG. 2 schematically illustrates a sense amplifier according to an embodiment of the present invention exploited in the memory device of FIG. 1.

Considering FIG. 2, a generic sense amplifier 200 of the read/write circuits, according to an embodiment of the present invention, is schematically shown.

The sense amplifier 200 includes a first current generator 205 and a second current generator 210 providing currents having a first amplitude Iread and a second amplitude ΔIread, respectively. The first and second current generators 205 and 210 have respective first terminals connected to a high voltage supply line Va. The current generators 205 and 210 have respective second terminals coupable to the selected bit line BL controlling a generic memory cell MC selected during a reading operation. In the drawing, the bit line selector and address decoder circuits between the read/write circuits and the bit line BL are not shown.

A first storage capacitance C1 and a first switch SW1 are connected together by respective first terminals; a second storage capacitance C2 and a second switch SW2 are connected together by respective first terminals. The first and second switches SW1 and SW2 have respective second terminals connected together to the bit line BL and the first and second storage capacitances C1 and C2 have respective second terminals connected to ground.

A first voltage V1 dropping across the first storage capacitance C1 and a second voltage V2 dropping across the second storage capacitance C2 are both supplied to an adder node 215, providing a voltage difference V2−V1 between the second voltage V2 and the first voltage V1.

A differential amplifier 220 has a non-inverting terminal "+" connected to the adder node 215 for receiving the voltage difference V2−V1 and an inverting terminal "−" receiving a reference voltage Vref. An output terminal of the differential amplifier 220 provides an output signal SAout indicative of a comparison between the voltage difference V2−V1 and the reference voltage Vref.

In detail, when the voltage difference V2−V1 is higher than the reference voltage Vref, the output signal SAout reaches a high value indicative of the logic value "0"; when the voltage difference V2−V1 is lower than the reference voltage, the output signal SAout reaches a low value indicative of the logic value "1".

The sense amplifier 200 includes a read control unit 225, receiving a read enabling signal READ_EN indicative that a reading operation on the memory device has to be performed. The read control unit 225 provides a plurality of control signals to the components of the sense amplifier 200 during the reading operation. In particular, the read control unit 225 provides a current enabling signal EN_I to the second current generator 210 for enabling the second current generator 210 when required (the first current generator 205 receives the read enabling signal READ_EN). The read control unit 225 further provides a first sampling signal SA1 and a second sampling signal SA2 to the first and second switches SW1 and SW2, respectively. The read control unit 225 further receives indicative of the bit line voltage $V_{BL}$.

Furthermore, the sense amplifier 200 can include a precharge circuit (not shown in the drawing) for precharging the bit line BL to a suitable voltage less than the minimum Vthoum in the block, in such a way to speed up the charging of the capacitor CBL at the start of the read cycle.

Figure 3:
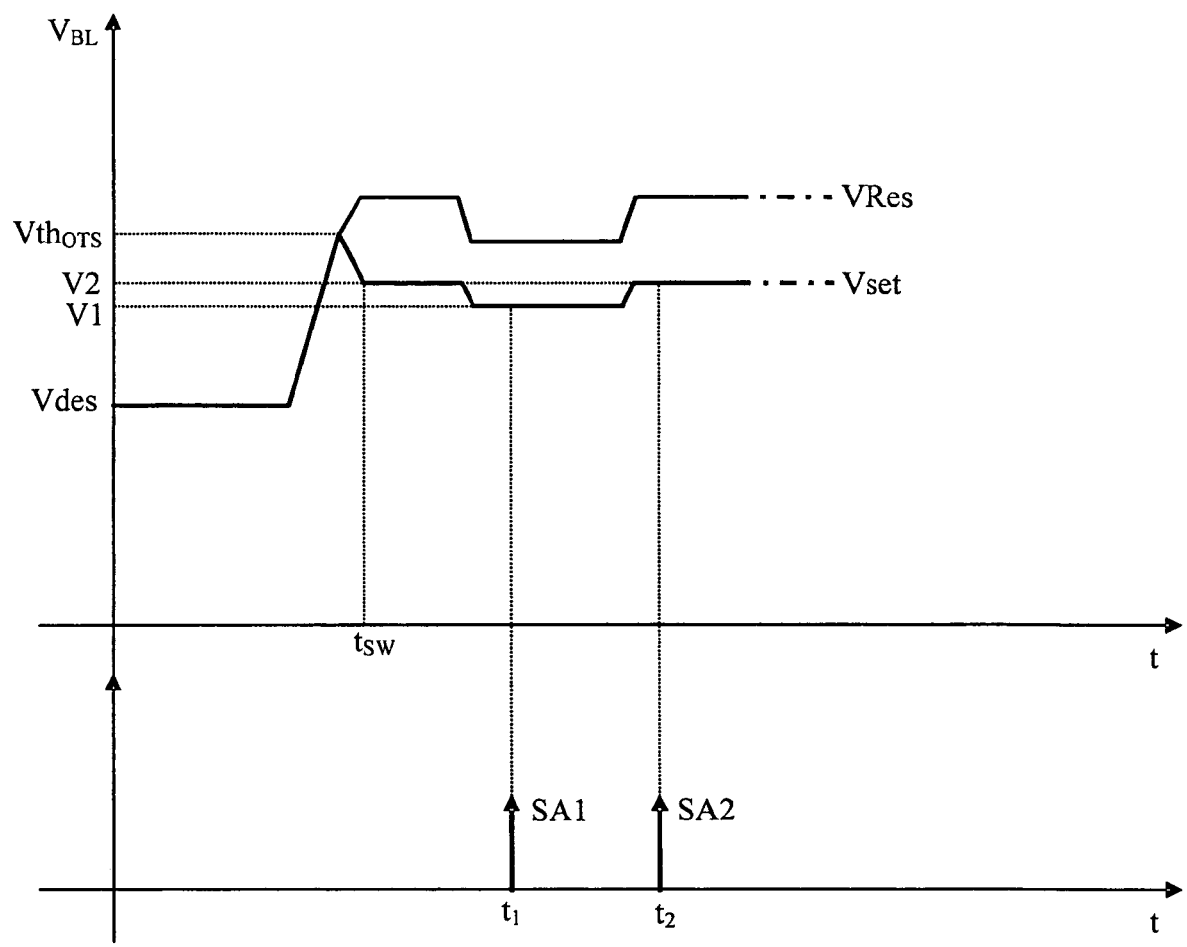
FIG. 3 represents a diagram of a bit line voltage vs. time, of the memory device during a reading operation performed by the sense amplifier of FIG. 2, and a diagram of control signals generated during the reading operation.

A reading operation will be described with reference to FIG. 3, representing a diagram of the bit line voltage $V_{BL}$ vs.

time, considered together with FIG. 2. FIG. 3 further illustrates a diagram of the control signals generated during the reading operation.

At the beginning of a reading operation the read enabling signal READ_EN is asserted; in response thereto the read control unit 225 asserts the current enabling signal EN_I. Then, both the first and second current generators 205 and 210 are enabled and a current pulse of amplitude Iread+ΔIread is forced into the bit line BL. The current Iread+ΔIread must be, with an OTS cell select device, low enough to avoid thresholding the OUM memory element but high enough to cause the switching of the access element OTS to the low-resistance condition (for example, the first read current pulse Iread+ΔIread is of about 7 μA).

As a consequence, the capacitor $C_{BL}$ starts charging, and the bit line voltage $V_{BL}$ increases accordingly. The bit line voltage $V_{BL}$ minus the selection voltage $V_{WL}$ at the word line (in the considered example approximately equal to 0 V) drops primarily across the access element OTS, since the impedance of the access element OTS is preferably greater than the impedance of the storage element OUM (irrespective of the logic value stored in the memory cell MC) until the OTS thresholds.

When the bit line voltage $V_{BL}$ reaches the threshold voltage $Vth_{OTS}$, the voltage across the access element OTS is sufficient to switch on the access element OTS, which, then, shows a relatively low dynamic resistance. When the access element OTS switches on, the voltage thereacross snaps back to the holding voltage $Vh_{OTS}$ and a snap-back voltage $Vth_{OTS}$-$Vh_{OTS}$ drops across the storage element OUM.

In response to the switching of the access element OTS after waiting an adequate time, at a switching time $t_{SW}$, the read control unit 225 de-asserts the current enabling signal EN_I for disabling the current generator 210. Consequently, a first read current of amplitude Iread (for example, of about 4 μA) that is less than the current Iread+ΔIread, is provided to the bit line BL. This first read current Iread is greater than the holding current Ih, so as to avoid switching off the access element OTS). Accordingly, the bit line voltage $V_{BL}$ may decrease irrespective of the logic value stored in the selected memory cell. A first steady-state value of the bit line voltage $V_{BL}$ is reached after some delay and the voltage depends on the stored logic value and Vh of the OTS, i.e. the resistance Rbit of the storage element OUM and Vh, the first steady-state value being equal to Rbit·Iread+Vh(ots).

The read control unit 225 asserts the first sampling signal SA1 at a first sampling time $t_1$ for closing the first switch SW1 so as to couple the first storage capacitance C1 to the bit line BL. The bit line voltage $V_{BL}$ then is sampled and held in the first storage capacitance C1.

Then, the read control unit 225 de-asserts the first sampling signal SA1 (for opening the first switch SW1) and asserts the current enabling signal EN_I for enabling again the current generator 210. Consequently, a second read current pulse of amplitude Iread+ΔIread is provided to the bit line BL, the magnitude of the total current suitably less than the current that will threshold the memory element if it is reset, and also less than the current that will change a set bit. Accordingly, the bit line voltage $V_{BL}$ increases irrespective of the logic value stored in the memory cell MC. A second steady value Rbit·(Iread+ΔIread)+Vh(Ots) of the bit line voltage $V_{BL}$ results, which is higher then the first steady value stored at t1, is reached and depends on the resistance of the stored logic value.

The read control unit 225 asserts the second sampling signal SA2 at a second sampling time $t_2$ for closing the second switch SW2. The bit line voltage $V_{BL}$ then is sampled and held in the second storage capacitance C2, preferably a capacitance about the same as C1, and preferably with a starting voltage before bit line connection about the same as C1 before it is connected to the bit line, using techniques familiar to those reasonably skilled. To minimize the effect of C1 and C2, the signal from the bit line may be buffered, such as with a unity gain op amp.

It has to be observed that, depending on the resistance Rbit of the storage element OUM of the selected memory cell MC, the difference in the first and second steady-state voltage of the bit line voltage $V_{BL}$ in the case of the stored amorphous logic value "0" is higher than the difference in the first and second steady-state voltage in the case of the stored crystalline logic value "1".

Sensing twice the bit line voltage $V_{BL}$ by exploiting the use of two current pulses having different amplitudes permits reducing the dependence on parameters varying from memory cell to memory cell, especially the variation in Vh(ots), and even with temperature. In this way, a more robust sense amplifier can be designed, since a discrimination margin between a reference voltage and the bit line voltage is increased by eliminating from the sense margin the variation in Vh(ots) and other variables common to the two voltages stored at t1 and t2.

A reading operation in which the bit line voltage is sensed twice involves a chain of events which inevitably slows down the reading operation. By detecting the time in which the access element has switched on, and further detecting the times in which the bit line voltage has reached steady-state values, it is possible to speed up such a chain of events. Without tracking dynamically the bit line voltage, it would be necessary to wait predetermined periods before sampling, allowing for the worst range of variability of the parameters of the memory device. The duration of a transient of the bit line voltage depends on the variability of the memory parameters and capacitance on the bit line. Referring to FIG. 3, one way to speed up is to sample SA2 after tsw and before the read current is reduced for sampling at t1.

Figure 4A:
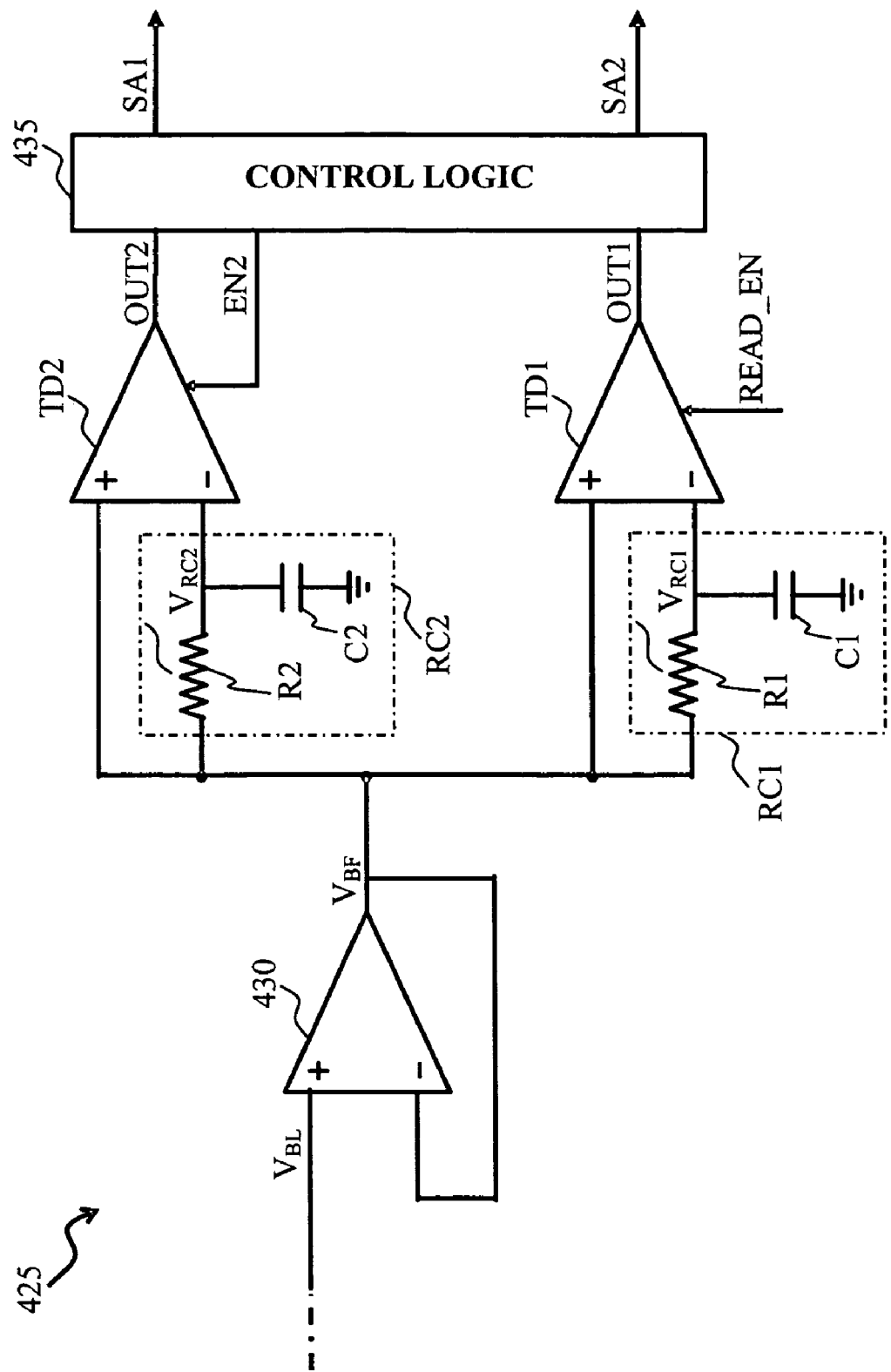
FIG. 4A shows a read control unit included in the sense amplifier of FIG. 2.

Referring now to FIG. 4A, a read control unit 425 of the sense amplifier 200, according to another embodiment of the present invention, is illustrated.

The read control unit 425 includes a buffer 430 having an input inverting terminal "−", an input non-inverting terminal "+" and an output terminal. The inverting terminal "−" of the buffer 430 is connected in negative feedback to the output terminal, while the non-inverting terminal "+" receives the bit line voltage $V_{BL}$. The output terminal of the buffer 430 provides a buffered voltage $V_{BF}$ corresponding to the bit line voltage $V_{BL}$; particularly, if the buffer 430 has a unitary gain, the buffered voltage $V_{BF}$ approximates the bit line voltage $V_{BL}$.

The read control unit 425 further includes a first and a second delayer circuits RC1 and RC2, each one consisting of a resistor R and a capacitor C labeled accordingly. The resistor R has a first terminal connected to the output terminal of the buffer 430 and a second terminal connected to a first terminal of the capacitor C having a second terminal connected to ground. A voltage $V_{RC}$ dropping across the capacitor C corresponds to the buffered voltage $V_{BF}$ delayed in time by a period τ depending on the resistor R and the capacitor C.

The read control unit 425 further includes a first and a second differential amplifiers TD1 and TD2. The respective non-inverting terminals "+" of the first and second differential amplifiers TD1 and TD2 receive the buffered voltage $V_{BF}$ and the respective inverting terminals "−" receive the delayed voltage $V_{RC}$.

The read control unit 425 further includes a control logic block 435; an inverted output terminal of the differential amplifiers TD1 and an output terminal of the differential amplifier TD2 are connected to the control logic block 435.

The internal architecture of the first and second differential amplifiers TD1 and TD2 is such that an offset voltage Vos (for example, of about 10 mV) drops between the inverting terminal "−" and the non-inverting terminal "+", but having opposite sign in the first and second differential amplifiers TD1 and TD2.

The output terminals of the first and second differential amplifiers TD1 and TD2 provide a first output signal OUT1 and a second output signal OUT2, respectively. The second output signal OUT2 assumes a high logic value when the buffered voltage $V_{BF}$ plus the offset voltage Vos is higher than the delayed voltage $V_{RC}$; otherwise the second output signal OUT2 assumes a low logic value. The first output signal OUT1 assumes a high logic value when the buffered voltage $V_{BF}$ minus the offset voltage Vos is lower than the delayed voltage $V_{RC}$, otherwise the first output signal OUT1 assumes a high logic value.

The control logic block 435 receives the output signals OUT1 and OUT2 and accordingly provides a plurality of corresponding control signals. Particularly, while the first differential amplifier TD1 is enabled by the read enabling signal READ_EN, the second differential amplifier TD2 is enabled by a control enabling signal EN2 provided by the control logic block 435. The plurality of control signals provided by the control logic block 435 further includes the first sampling signal SA1 and the second sampling signal SA2.

Figure 4B:
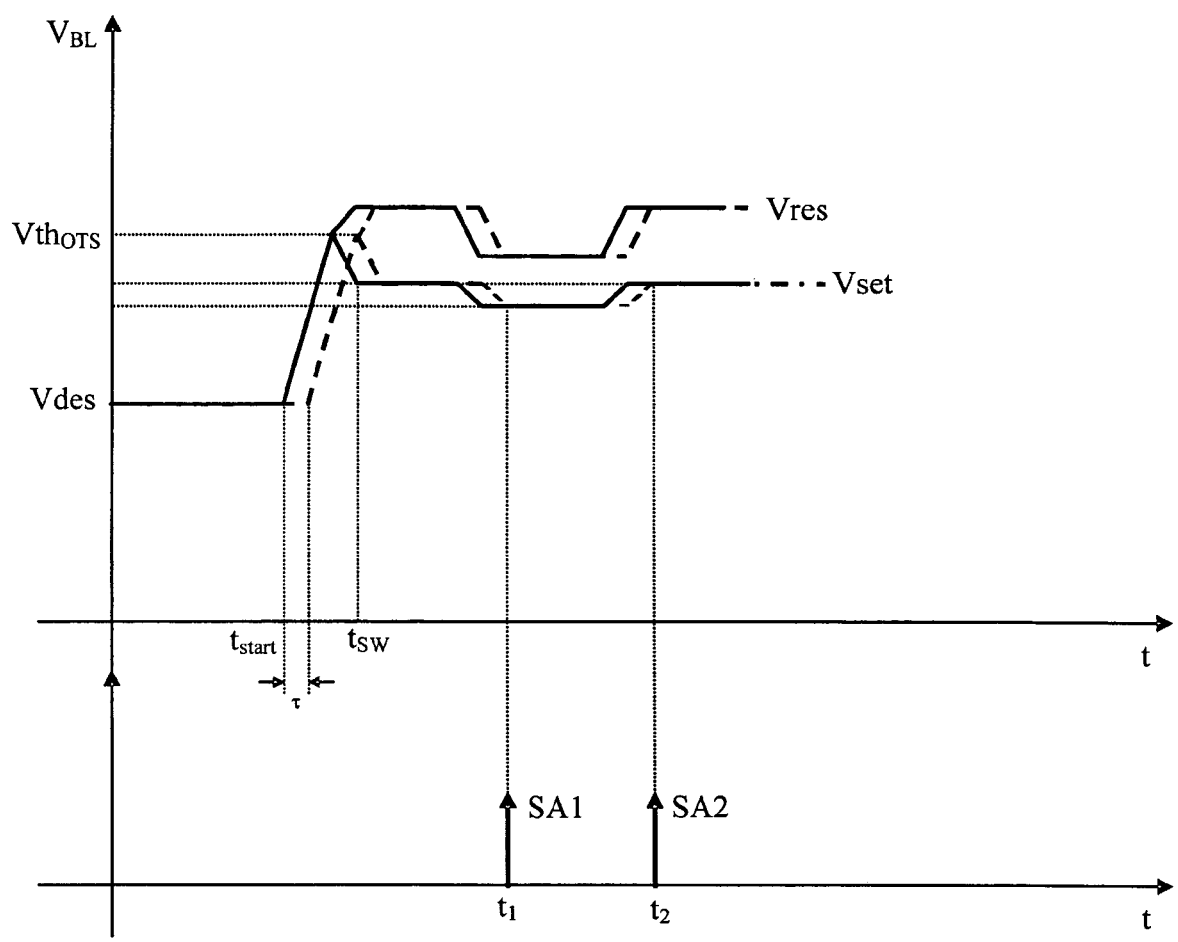
FIG. 4B represents a diagram of voltages, related to the bit line voltage vs. time during a reading operation performed by the sense amplifier of FIG. 2, and a diagram of the control signals generated during the reading operation.

The operation of the read control unit 425 will be described with reference to FIG. 4B, representing a diagram of the buffered voltage $V_{BF}$ and of the delayed voltage $V_{RC}$ vs. time, considered together with FIG. 4A; FIG. 4B further illustrates a diagram of the control signals generated during the reading operation. In FIG. 4B the buffered voltage $V_{BF}$ is schematically drawn in continuous line, while the delayed voltage $V_{RC}$ is schematically drawn in dashed line.

At the beginning of a reading operation the read enabling signal READ_EN is asserted; in response thereto the first differential amplifier TD1 is enabled.

The switching of the access element OTS is detected when the buffered voltage $V_{BF}$ minus the offset voltage Vos drops below the delayed voltage $V_{RC}$; therefore, the first output signal OUT1 switches to the high logic value at a switching time $t_{SW}$.

It is to be observed that the internal offset voltage Vos of the first differential amplifier TD1 permits to keep stable the value of the first output signal OUT1 also when the delayed voltage $V_{RC}$ and the buffered voltage $V_{BL}$ reaches the same value.

In response to the high logic value reached by the first output signal OUT1, the control logic 435 further asserts the control enabling signal EN2 for enabling the second differential amplifier TD2.

The first steady condition is detected when the buffered voltage $V_{BF}$ plus the offset voltage Vos is higher than the delayed voltage $V_{RC}$. Then, the second output signal OUT2 switches to the high logic value (the internal offset voltage Vos of the second differential amplifier TD2 permits to keep stable the value of the second output signal OUT2). In response thereto the control logic block 435 asserts the first control signal SA1 at the first sampling time $t_1$ for sampling the first steady-state value of the bit line voltage $V_{BL}$.

The second steady-state value is detected at t2 when the buffered voltage $V_{BF}$ minus the offset voltage Vos is lower than the delayed voltage $V_{RC}$; therefore, the first output signal OUT1 switches again to the high logic value and accordingly the control logic 435 asserts the second control signal SA2 for sampling the second steady-state value of the bit line voltage $V_{BL}$.

The above-described read control unit is adapted to generate an auto-timing sequence for sensing twice the bit line voltage. The read control unit has circuit blocks identified by the respective delayer circuits connected to the respective differential amplifiers. Particularly, a first circuit block detects the switching of the access element and the second steady state; a second circuit block detects the first steady state. Variations on the approach herein described will be apparent to those reasonably skilled in the art. Alternatives using the concept herein described diagrammatically may be implemented, for example, wherein the column level is sensed and stored shortly after tsw for comparison to a level generated shortly after the current changes at or after t1. The RC's may be adjusted so that the times respectively at tsw and t1 may be used to generate the two levels subtracted one from the other, and then compared to the Vref to determine cell state. Similarly, multiple Vref may be generated and four or more resistance ranges written into the cell to store more than one logical bit per physical cell.

Figure 5:
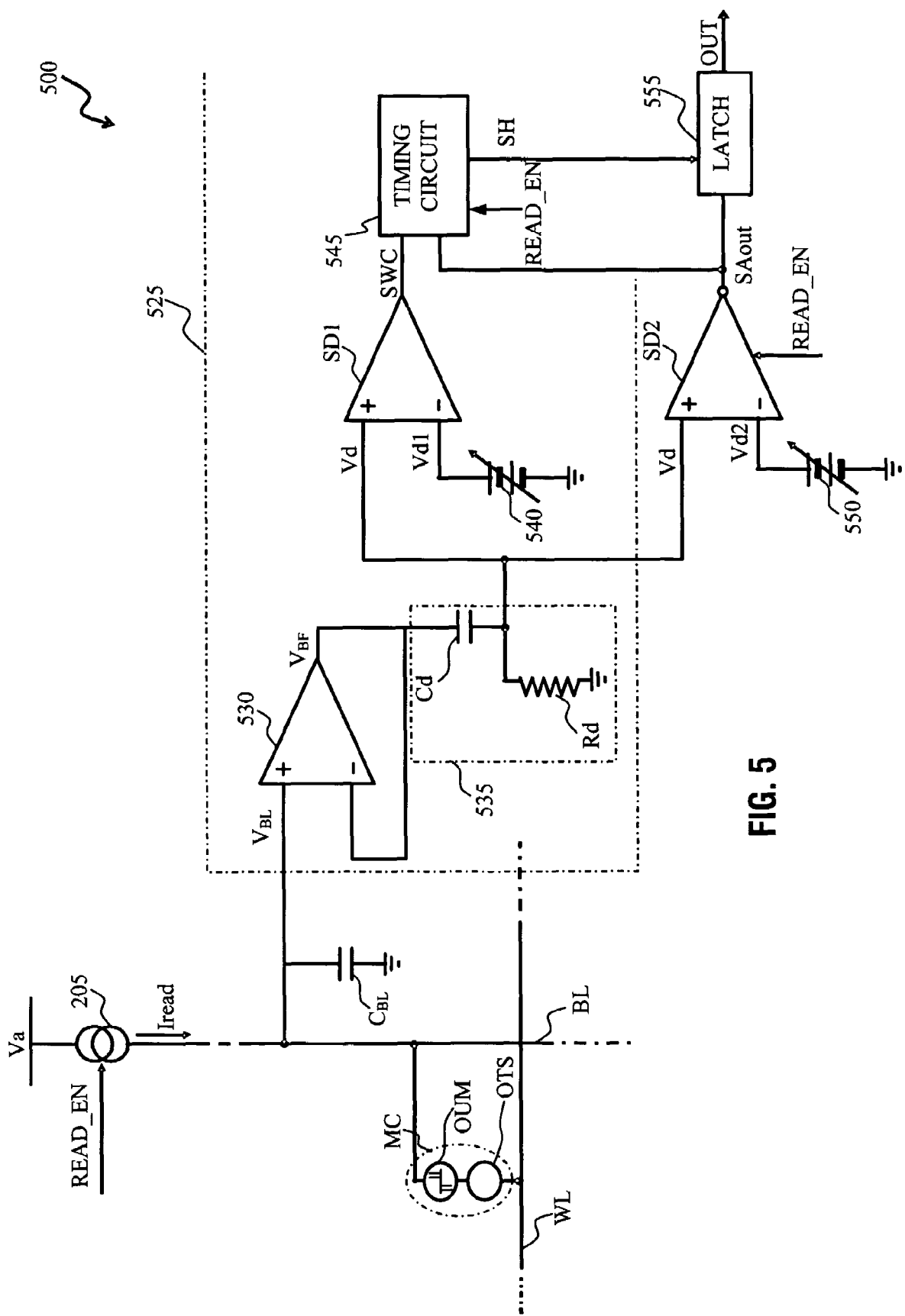
FIG. 5 illustrates a sense amplifier according to a further embodiment of the present invention.

Now considering FIG. 5, a sense amplifier 500 according to another embodiment of the present invention is shown. The sense amplifier 500 performs the reading operation in fewer phases and may have only one current generator 205 (in place of the two current generators of FIG. 2).

The sense amplifier 500 includes a read control unit 525 having a buffer 530, which provides a buffered voltage $V_{BF}$ corresponding to the bit line voltage $V_{BL}$.

The read control unit 525 further includes a capacitor Cd and a resistor Rd implementing a differentiator 535. The capacitor Cd is serially connected to the buffer 530 (with a first terminal of the capacitor Cd that is connected to the output terminal of the buffer 530). The capacitor Cd has a second terminal connected to a first terminal of the resistor Rd with a second terminal connected to ground. The first terminal of the resistor Rd provides a derivative voltage Vd, corresponding to the time-derivative of the bit line voltage $V_{BL}$.

The read control unit 525 includes a differential amplifier SD1 having an input non-inverting terminal "+" connected to the first terminal of the resistor Rd for receiving the derivative voltage Vd. An input inverting terminal "−" of the differential amplifier SD1 is connected to an adjustable voltage generator 540 supplying a first adjustable voltage Vd1.

An output terminal of the differential amplifier SD1 provides a switching control signal SWC according to a comparison between the derivative voltage Vd and the first adjustable voltage Vd1.

The read control unit 525 also comprises a timing circuit 545; the switching control signal SWC is input to the timing circuit 545. The timing circuit 545 is enabled by the read enabling signal READ_EN.

The sense amplifier 500 comprises a sensing differential amplifier SD2 having an input non-inverting terminal "+" connected to the first terminal of the resistor Rd for receiving the derivative voltage Vd from the read control unit 525. An input inverting terminal "−" is connected to a further adjustable voltage generator 550 supplying a second adjustable voltage Vd2, suitably lower than the first adjustable voltage Vd1, as described in greater detail in the following.

An output terminal of the sensing differential amplifier SD2 is inverted and provides an output signal SAout indicative of a comparison between the derivative voltage Vd and the second adjustable voltage Vd2.

The output terminal of the sensing differential amplifier SD2 is connected to a latch 555 for storing the value of the output signal SAout when enabled. The latch 555 outputs a latched value OUT, corresponding to the value of the output signal SAout.

The output signal SAout is provided to the control timing circuit 545, which provides a timing signal SH according to the switching control signal SWC and to the output signal SAout.

The timing signal SH is provided to the latch 555, which is enabled when the timing signal SH is asserted.

Figure 6:
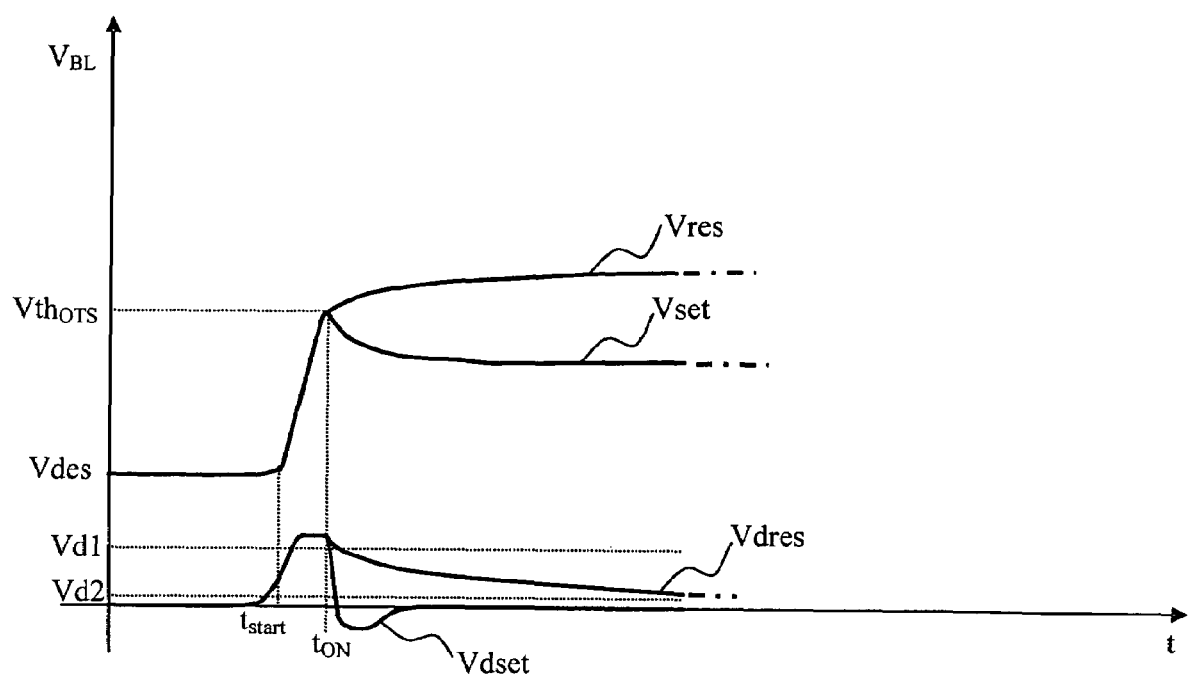
FIG. 6 represents a diagram of the bit line voltage (and related voltages) vs. time during a reading operation performed by the sense amplifier of FIG. 5.

The operation of the read control unit 525 will be described with reference to FIG. 6, in which a diagram of the bit line voltage $V_{BL}$ and of the derivative voltage Vd vs. time is schematically drawn, considered together with FIG. 5.

During a reading operation, when the current generators 205 is enabled by the read enabling signal READ_EN, the current Iread is forced into the bit line BL beginning at tstart. As described above, the charging of the capacitor $C_{BL}$ causes a transient of the bit line voltage $V_{BL}$, which increases from the de-selection voltage Vdes towards a steady-state value. After the cell select element switches at ton, the Vfinal changes to reflect the logic resistance value stored in the selected memory cell, respectively Vres or Vset.

At the switching time $t_{ON}$ the access element OTS switches on. Supposing that the memory cell MC stores the logic value "1", the cell current and the resistance Rbit are such that the bit line voltage $V_{BL}$ starts decreasing towards a set steady-state value (in this case the bit line voltage $V_{BL}$ is referred to as set voltage Vset).

In the case in which the memory cell MC stores the logic value "0", the bit line voltage $V_{BL}$, depending on the resistance Rbit and also on the snap-back voltage $Vth_{OTS}$-$Vh_{OTS}$, may still increase after ton but with a lower gradient in progressing towards a reset steady-state value Vres higher than the set steady-state value Vset.

The derivative voltage Vd corresponds to the gradient (rate of change) of the bit line voltage $V_{BL}$. Accordingly, at the start time $t_{start}$ of the reading operation the derivative voltage Vd starts increasing from zero and then flattens until the time $t_{ON}$ in which the access element OTS switches on.

Then, in the case in which the memory cell MC stores the logic value "1" set resistance, the derivative voltage Vd decreases rapidly and may become negative (in this case the derivative voltage Vd is referred to as set derivative voltage Vdset). While the set voltage Vset approaches the set steady-state value, the set derivative voltage Vdset starts again increasing as the rate of change slows. The set derivative voltage Vdset reaches the value zero when the set voltage flattens as the set steady-state value Vfinal is reached.

In the case in which the memory cell MC stores the logic value "0" reset resistance, the derivative voltage Vd decreases slower than the set derivative voltage Vdset, because the reset voltage Vres either stops or changes with a lower gradient after ton (in this case the derivative voltage Vd is referred to as reset derivative voltage Vdres). Because of its higher resistance Rbit, the reset steady-state may be reached slower than the Vfinal for the set voltage Vset, unless IreadxRcell=Vthots−Vhots. Accordingly, the reset derivative voltage Vdres may decrease slower towards zero, so Vdres is more positive than Vdset after Ton.

The first adjustable voltage Vd1 is selected for being lower than a maximum value reached by the derivative voltage Vd. The second adjustable voltage Vd2 is selected for being suitably lower than the first adjustable voltage Vd1, but may be less than zero if Vres may decrease after ton, and otherwise equal to or greater than zero.

When the derivative voltage Vd drops below the first adjustable voltage Vd1, the switching control signal SWC provided by the differential amplifier SD1, initially at a low logic value, switches to a high logic value indicating that the access element OTS has switched. The output signal SAout provided by the sensing differential amplifier SD2 is at a low logic value until the derivative voltage Vd is greater than the second adjustable voltage Vd2.

When the derivative voltage Vd drops below the second adjustable voltage Vd2, i.e. in the case of the set derivative voltage Vdset, the output signal SAout switches to the high logic value. Then, the timing block 545 receives the switching control signal SWC and the output signal SAout both asserted. Accordingly, the timing block 545 asserts the timing signal SH and enables the latch 555 to store the value of the output signal SAout.

Otherwise, if, after a predetermined period (for example, ten nanoseconds) from a time $t_{ON}$ when the access element OTS has switched (the switching control signal SWC has switched to the high logic value), the output signal SAout is again at the low logic value, i.e. in the case of the reset derivative voltage Vdres, the timing block 545 enables the latch 555 to latch a reset state, 0.

Accordingly, the latched value OUT of the output signal SAout corresponds to the logic value stored in the selected memory cell MC.

Detecting the switching of the access element, and then timing the reading operation in an "auto-adaptative" way, is particularly advantageous since it is possible to limit the duration of a current pulse and reduce read access delay. Particularly, it is possible to sense the bit line voltage before reaching a steady state. This allows further speeding up the reading operation by exploiting a current pulse having an amplitude closer to or even modestly greater than the threshold current of the storage element. In fact, the duration of the current pulse width can be limited in such a way that is not sufficiently long to threshold a reset OUM or spuriously program the storage elements even when the read current exceeds Ithoum.

Figure 7:
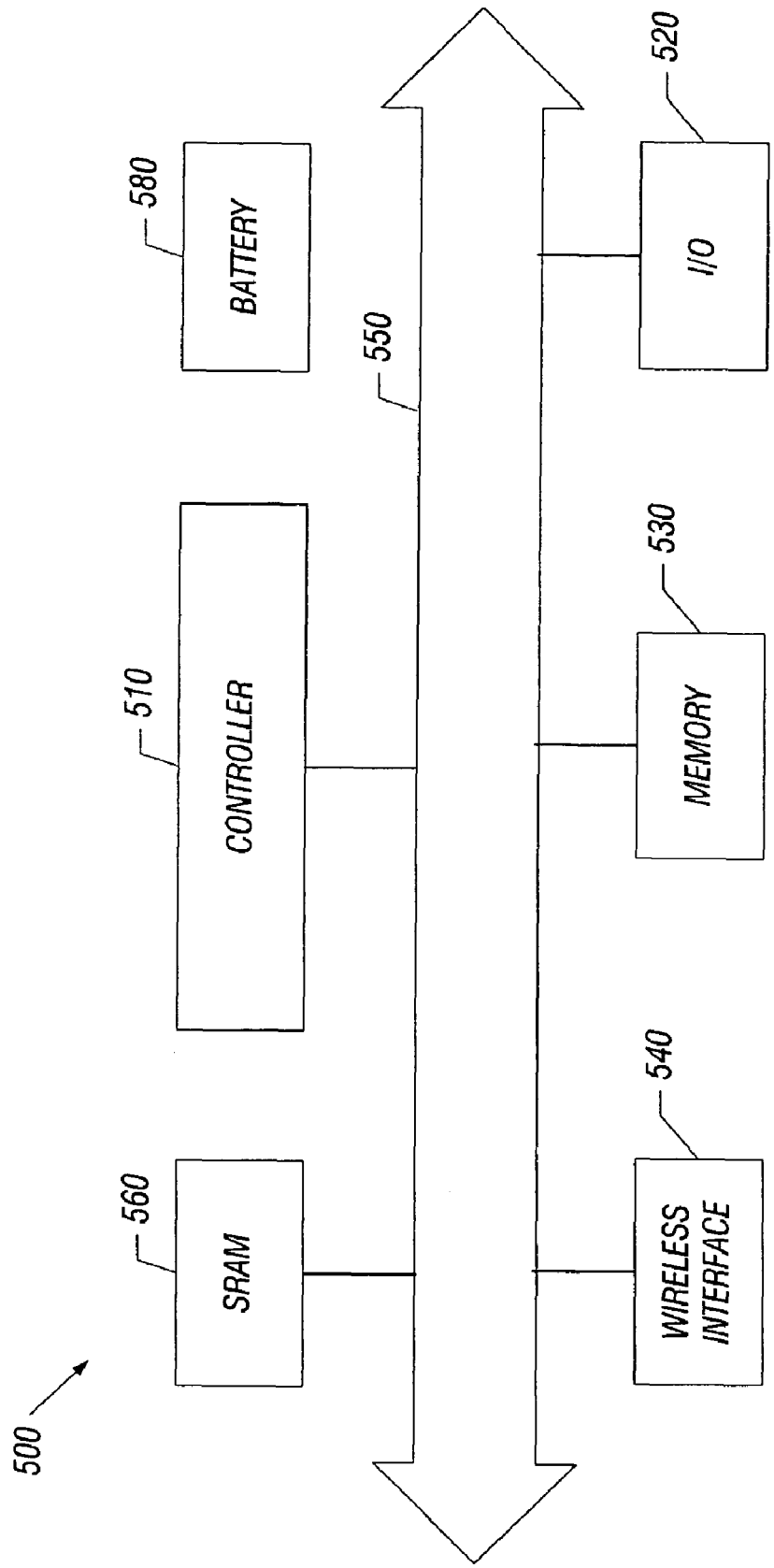
FIG. 7 shows a system in accordance with one embodiment.

Turning to FIG. 7, a portion of a system 500 in accordance with an embodiment of the present invention is described. System 500 may be used in wireless devices such as, for example, a personal digital assistant (PDA), a laptop or portable computer with wireless capability, a web tablet, a wireless telephone, a pager, an instant messaging device, a digital music player, a digital camera, or other devices that may be adapted to transmit and/or receive information wirelessly. System 500 may be used in any of the following systems: a wireless local area network (WLAN) system, a wireless personal area network (WPAN) system, or a cellular network, although the scope of the present invention is not limited in this respect.

System 500 may include a controller 510, an input/output (I/O) device 520 (e.g. a keypad, display), a memory 530, a wireless interface 540, and a static random access memory (SRAM) 560 and coupled to each other via a bus 550. A battery 580 may supply power to the system 500 in one embodiment. It should be noted that the scope of the present invention is not limited to embodiments having any or all of these components.

Controller 510 may comprise, for example, one or more microprocessors, digital signal processors, micro-controllers, or the like. Memory 530 may be used to store messages transmitted to or by system 500. Memory 530 may also optionally be used to store instructions that are executed by controller 510 during the operation of system 500, and may be used to store user data. Memory 530 may be provided by one or more different types of memory. For example, memory 530 may comprise a volatile memory (any type of random access memory), a non-volatile memory such as a flash memory, and/or memory device 100 illustrated in FIG. 1.

The I/O device 520 may be used to generate a message. The system 500 may use the wireless interface 540 to transmit and receive messages to and from a wireless communication network with a radio frequency (RF) signal. Examples of the wireless interface 540 may include an antenna, or a wireless transceiver, such as a dipole antenna, although the scope of the present invention is not limited in this respect. Also, the I/O device 520 may deliver a voltage reflecting what is stored as either a digital output (if digital information was stored), or it may be analog information (if analog information was stored).

While an example in a wireless application is provided above, embodiments of the present invention may also be used in non-wireless applications as well.

Although the present invention has been described above with a certain degree of particularity with reference to preferred embodiments thereof, it should be understood that various changes in the form and details as well as other embodiments are possible. For example, the memory cells can be multi-level memory cells storing more than one bit. Alternatively, the memory device includes an alignment or even a multi-dimensional arrangement of memory cells, one stacked atop another. The sensing means may be differential amplifiers for comparing an electrical quantity corresponding to the logic value stored in the memory cell with reference values, but also alternative circuits or devices can be exploited. Furthermore, the read control unit can have a different architecture and can include devices or circuits different than differential amplifiers for tracking the bit line voltage. Particularly, the delayer circuits or the differentiator can be implemented in an alternative way.

Moreover, it will be apparent to those reasonably skilled in the art that the additional features providing further advantages are not essential for carrying out the invention, and may be omitted or replaced with different features. For example, the memory cell can include a switch different than the access element made of a phase-change material and the switching of the access element can be detected in a different way. The reading operation can be performed by sensing twice the bit line voltage, but also a conventional reading operation, in which a single value of the bit line voltage is sensed. A further embodiment of the present invention can track the bit line voltage by exploiting both the delayer circuits and differentiators (for example, the differentiator can be used to generate timing for sensing twice the bit line voltage instead of the delayer circuit, and vice versa).

Further, Vd1 and Vd2 may be generated from a peak detector that senses the peak voltage reached by the differentiator, allowing the reference voltages to dynamically track relative to the peak, thus generating more precise levels for the rate of change comparator reference levels.

What is claimed is:

1. A method comprising:
providing a read biasing current and a second read current lower than the read biasing current;
applying the read biasing current to a memory cell in response to the selection of the memory cell;
detecting a first steady condition of the memory cell corresponding to the read biasing current;
sensing a first measuring voltage in response to the detection of the first steady condition;
applying the second read current to the memory cell in response to the sensing of the first measuring voltage;
detecting a second steady condition of the memory cell corresponding to the second read current;
sensing a second measuring voltage in response to the detection of the second steady condition; and
determining a logic value stored in the memory cell according to the first and the second measuring voltages.

2. The method according to claim 1, wherein detecting the second steady condition includes identifying a first change of rate of an electrical quantity, and detecting the first steady condition includes identifying a second change of rate after the first change of rate.

3. The method according to claim 2, wherein detecting the first and second changes of rate includes delaying the electrical quantity by a predetermined period and identifying the corresponding change of rate when the delayed electrical quantity reaches the electrical quantity within a predetermined offset, the offsets for the first and second changes of rate having opposite signs.

4. A phase change memory comprising:
a circuit coupled to a memory cell to provide a read biasing current and a second read current lower than the read biasing current, said circuit to apply the read biasing current to the memory cell in response to a selection of the memory cell;
a first detector coupled to the memory cell to detect a first steady condition of the memory cell corresponding to the read biasing current;
a first device coupled to the memory cell to sense a first measuring voltage in response to the detection of the first steady condition and to apply the second read current to the memory cell in response to the sensing of the first measuring voltage;
a second detector coupled to the memory cell to detect a second steady condition of the memory cell corresponding to the second read current;
a second device coupled to the memory cell to sense a second measuring voltage in response to the detection of the second steady condition; and
a third device coupled to the memory cell to determine a logic value stored in the memory cell according to the first and second measuring voltages.

5. The memory of claim 4 wherein the second detector to detect the second steady condition to identify a first change of rate of an electrical quantity, and said first detector to detect the first steady condition to identify a second change of rate after the first change of rate.

6. The memory of claim 5 wherein said second detector to detect the second steady condition and said first detector to detect said first steady condition to detect the first and second changes of rate by delaying the electrical quantity by a predetermined period and identifying the corresponding change of rate when the delayed electrical quantity reaches the electrical quantity within a predetermined offset, the offset for the first and second changes of rate having opposite signs.

7. The memory of claim 4 wherein said memory is a phase-change memory including a chalcogenide.

8. The memory of claim 7 wherein said phase-change memory includes a storage element and an access element.

9. The memory of claim 8 wherein said access element includes a threshold switch element made of a single phase of material.

10. A system comprising:
a controller; and
a phase-change memory coupled to said controller to provide a read biasing current and a second read current lower than the read biasing current, to apply the read biasing current to a memory cell in response to the selection of the memory cell, to detect a first steady condition of the memory cell corresponding to the read biasing current, to sense a first measuring voltage in response to the detection of the first steady condition, to apply the second read current to the memory cell in response to the sensing of the first measuring voltage, to detect a second steady condition of the memory cell corresponding to the second read current, to sense a second measuring voltage in response to the detection of the second steady condition, and to determine a logic value stored in the memory cell according to the first and second measuring voltages.

11. The system of claim 10 wherein said memory to identify a first change of rate of an electrical quantity and identifies a second change of rate after the first change of rate.

12. The system of claim 11, said memory to delay the electrical quantity by a predetermined period and identify the corresponding change of rate when the delayed electrical quantity reaches the electrical quantity within a predetermined offset, the offsets for the first and second changes of rate having opposite signs.

* * * * *